United States Patent
Takashima

[19]

[11] Patent Number: 5,301,089
[45] Date of Patent: Apr. 5, 1994

[54] PARALLEL PROCESSING SYSTEM

[75] Inventor: Tokuhei Takashima, Tokyo, Japan

[73] Assignee: Graphico Co., Ltd., Tokyo, Japan

[21] Appl. No.: 870,669

[22] Filed: Apr. 17, 1992

[30] Foreign Application Priority Data

Apr. 19, 1991 [JP] Japan .................. 3-115283

[51] Int. Cl.$^5$ .................. H05K 7/00; H05K 9/00; H01R 9/09
[52] U.S. Cl. .................. 361/744; 361/784; 361/792; 361/816; 439/65; 439/69; 439/188
[58] Field of Search ........ 361/396, 397, 407, 412–415, 361/424; 439/61, 65, 68, 69, 74, 79, 188

[56] References Cited

U.S. PATENT DOCUMENTS

| | | | |
|---|---|---|---|
| 4,922,381 | 5/1990 | Longerich et al. | 361/414 |
| 4,953,060 | 8/1990 | Lauffer et al. | 361/396 |
| 5,014,163 | 5/1991 | Lin | 361/415 |
| 5,016,138 | 5/1991 | Woodman | 361/396 |
| 5,060,111 | 10/1991 | Takashima | 361/413 |
| 5,119,273 | 6/1992 | Corda | 361/424 |
| 5,210,682 | 5/1993 | Takashima | 361/407 |

FOREIGN PATENT DOCUMENTS 2-281359  11/1990  Japan .

OTHER PUBLICATIONS

IBM Tech. Disclosure Bulletin vol. 33 No. 1A Jun. 199, "Stacked Board Power Bus Design" pp. 366–368.

Primary Examiner—Paula A. Bradley
Attorney, Agent, or Firm—Birch, Stewart, Kolasch & Birch

[57] ABSTRACT

Disclosed is an improved parallel processing system using a radial bus assembly comprising a stack of disks each having an integrated circuit crossbar switch fixed at its center, a plurality of communication lines of equal length radially extending from the communication terminals of the crossbar switch and terminating on the circumference of the disk, a plurality of control lines each being arranged between adjacent communication lines, and radially extending from the control terminals of the crossbar switch and terminating short of the circumference of the disk, and male-and-female joints to electrically connect the terminations of the control lines of all disks in terms of same angular positions longitudinally in common. This arrangement permits substantial reduction of disk size by shifting the control terminals from the circumference of the disk to the inside space thereof, thus accordingly reducing the whole size of the laminated cylindrical bus structure, and hence increasing the data transfer speed on shortened radial communication lines.

2 Claims, 6 Drawing Sheets

PARALLEL PROCESSING SYSTEM

BACKGROUND OF THE INVENTION

1. Field of the Invention

The present invention relates to a parallel processing system which permits a plurality of processing units to work simultaneously at an increased speed, accordingly permitting the quick processing of a lot of information data such as in colored image processing.

2. Description of the Prior Art

As a means to make electrical interconnections of numerous processing units such as data processors or memories Japanese Patent Application Public Disclosure No.2-281359 shows a radially parallel type of bus system which comprises a stack of disks each bearing a plurality of radial signal lines of equal length radiating from its center. A corresponding plurality of CPU boards are erected and arranged around the disk stack, and are connected to the signal lines of all disks.

Disadvantageously this conventional bus system permits only two selected processing units to communicate with each other at one time, and therefore, it is inappropriate for dealing with many processing units or for permitting processing units to communicate with each other very often. In an attempt to permit many processing units to communicate with each other simultaneously the inventor proposed an improvement of such radially parallel type of bus system. As shown in FIG. 9, it includes a stack of disks 4. Each disk has an integrated circuit crossbar switch 1 fixed at its center, communication lines 3A (for instance, 16 lines), control lines 3B (for instance, 10 lines), power lines 3C and ground lines 3D all radially extending from the terminals 2 of the crossbar switch 1 and terminating on the circumference of the disk. These disks 4 are arranged vertically at regular intervals with their centers on a common axis and with all communication lines 3A, control lines 3B, power lines 3C and ground lines 3D arranged vertically in registration. Thus, a three-dimensional bus system 5 results. A plurality of longitudinal connectors 6 are attached to the circumference of the cylindrical lamination 5, and a corresponding plurality of boards 7 are applied to the longitudinal connectors 6, each board carrying an associated processor or memory, thus permitting the crossbar switches 1 to make electrical connections between selected boards 7 with the aid of a switching control (in FIG. 9), which sends control signals to the crossbar switches 1 via selected control lines 3B. This arrangement permits the simultaneous data transfer between selected processing units.

The communication lines, control lines and other different lines are terminated on the circumference of cylindrical lamination, specifically terminated with associated terminals of substantial physical size, much larger than the line. Therefore, the circumferential size of the disk must be increased with the increase of the lines printed on the disk because otherwise, a required number of terminals could not be placed on the circumference of the disk. This causes disadvantages of increasing the whole size of cylindrical lamination, and of increasing the length of communication line, and accordingly the time required for transferring data between selected processing units. Stated otherwise, the number of communication lines cannot be increased without increasing unavailable space, specifically interline space.

SUMMARY OF THE INVENTION

One object of the present invention is to provide an improved parallel processing bus system, which permits reduction of the disk size, accordingly the data transfer time between processing units selected among associated numerous ones.

To attain this object a parallel processing bus system according to the present invention comprises: a radial bus assembly comprising a stack of disks each having an integrated circuit crossbar switch fixed at its center, a plurality of communication lines of equal length radially extending from the communication terminals of said crossbar switch and terminating on the circumference of the disk, a plurality of control lines each being arranged between adjacent communication lines, and radially extending from the control terminals of said crossbar switch and terminating short of the circumference of the disk, and common connector means to electrically connect the terminations of said control lines of all disks in terms of same angular positions longitudinally in common; a plurlaity of boards each having a processing unit and means to electrically connect said processing unit to the termination of each of said communication lines, said boards being arranged radially around said stack of disks; and a switching control unit connected to said common connector means for controlling the closing-and-opening of the contacts of all crossbar switches in unison.

The common connector means may comprise male-and-female joints fixed to the disk with their male parts thrusting therethrough, and each disk may have a plurality of receptacles on its circumference to terminate all communication lines.

The communication lines of all disks are grouped longitudinally in terms of angular positions in each disk to constitute parallel bus units extending in longitudinal and radial planes and converging to the crossbar switches. The coplanar communication lines in a same group are allotted to data-transferring, addressing and controlling. These different lines in all groups may be selectively connected to each other by controlling the crossbar switches, and accordingly associated processing units such as procesors or memories may be selectively connected to each other simultaneously.

Thanks to arrangement of the control lines between adjacent communication lines and thanks to termination of the control lines short of the circumference of each disk the terminals of these control lines can be arranged between adjacent communication lines in place of the circumference of the disc, thus permitting reduction of the circumference length compared with that which would be required if such control terminals were arranged alternately with the communication terminals on the circumference of the disk. Thus, the whole space of the disk is most effectively used, and accordingly the whole size of the bus system is reduced. The control terminals of al 1 disks may be connected longitudinally in terms of same angular positions, and the longitudinally coplanar control lines may be supplied with same control signals. The longitudinally and radially coplanar connections of the control lines of all disks may be effected with the aid of male-and-female joints in such a detachable way that the cylindrical lamination may be disassembled with ease when demanded for repair or change of defective disks.

BRIEF DESCRIPTION OF THE DRAWING

Other objects and advantages of the present invention will be understood from the following description of preferred embodiments which are shown in accompanying drawings.

DETAILED DESCRIPTION OF PREFERRED EMBODIMENTS

Figure 1:
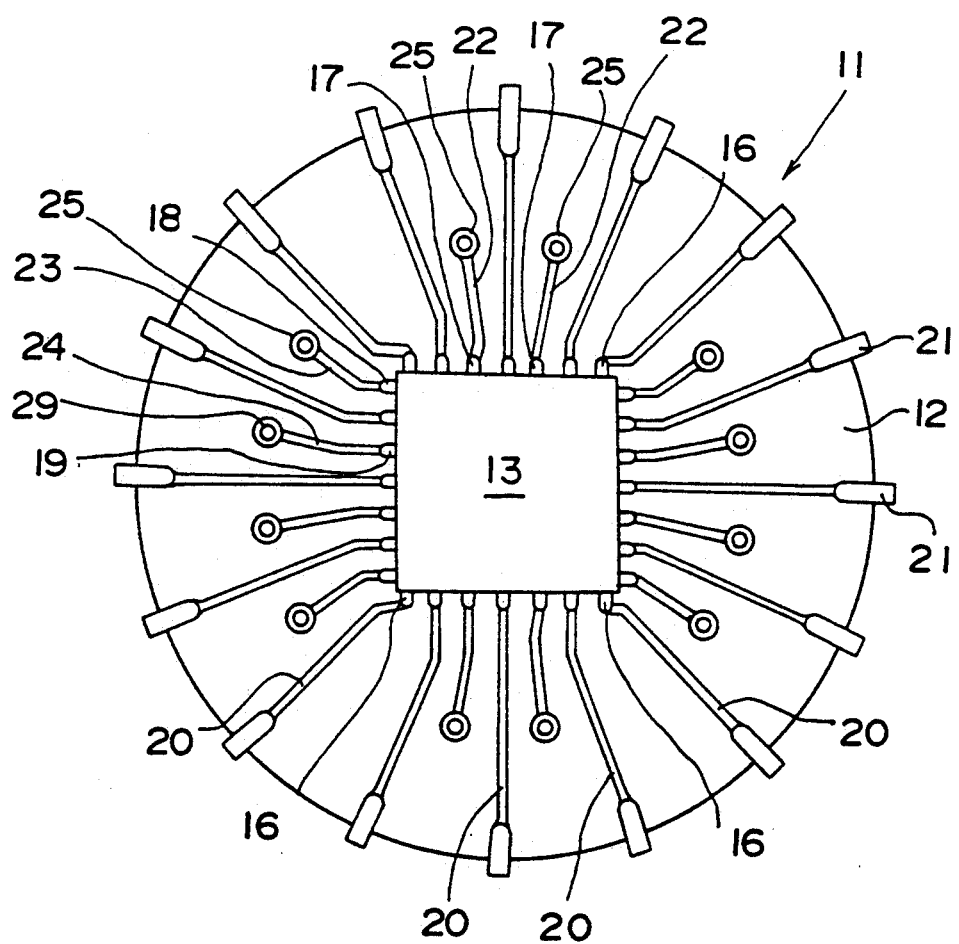
FIG. 1 is a plane view of a disk having a radial bus pattern printed thereon and a crossbar switch fixed at its center.
Figure 2:
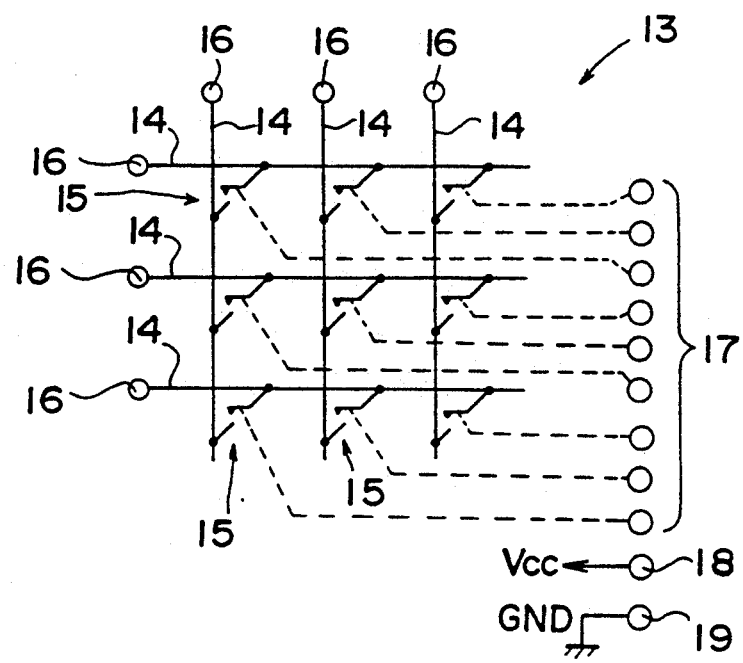
FIG. 2 is an equivalent circuit of the crossbar switch.

FIG. 1 is a plane view of a disk unit 11 which is a unitary element of a parallel processing system according to the present invention. It comprises a printed disk board 12 having a radial bus pattern printed thereon and a crossbar switch 13 fixed at its center. The crossbar switch 13 has numerous contacts 15 arranged at the crossings of a lattice network of signal lines 14 as seen from the equivalent circuit of FIG. 2. These signal lines 14 are terminated with terminals 16. In addition, it has control, power and ground terminals 17, 18 and 19. Control signals are applied to selected control terminals for controlling the closing-and-opening of selected contacts.

Figure 3:
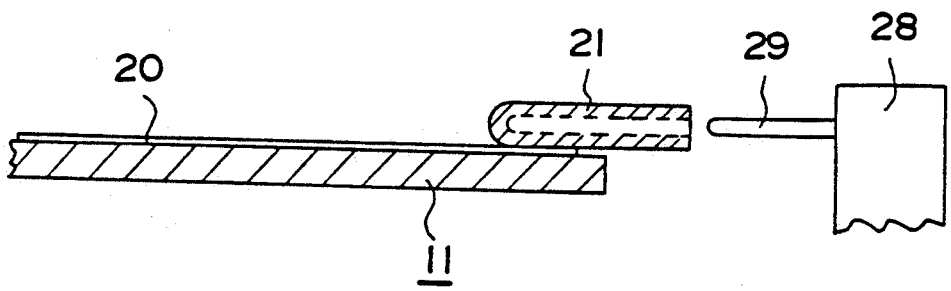
FIG. 3 is a longitudinal section of a receptacle connected to a communication line and attached to the circumference of the disk.

All communication lines 20 of same radial length are connected to the communication terminals of the crossbar switch 13 and to the receptacles 21, which are fixed to the circumference of the disk 11 for accepting the male pins 29 of associated longitudinal connector housings 28, as seen from FIG. 3. The control lines 22 are arranged between adjacent communication lines 20, and are connected to the control terminals of the crossbar switch 13. Likewise, the power lines 23 and the ground lines 24 are arranged between adjacent communication lines 20, and are connected to the associated terminals 18 and 19 of the crossbar switch 13.

Figure 4:
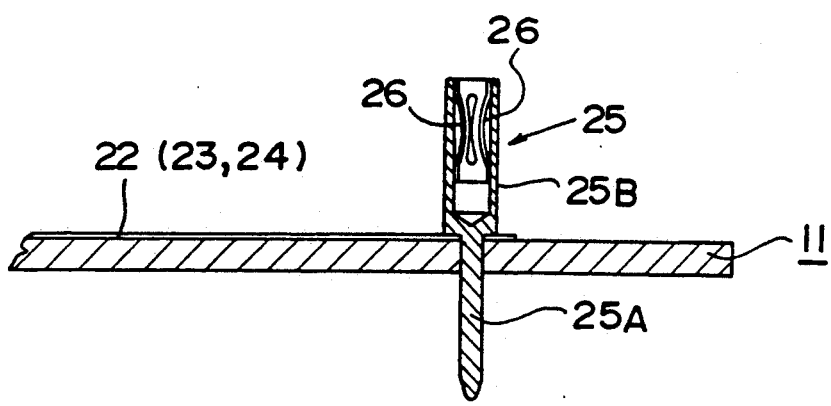
FIG. 4 is a longitudinal section of a male-and-female joint connected to a control line and attached to the disk at an inner distance apart from the circumference of the disk.

It should be noted that the lines 22, 23 and 24 other than the communication lines 20 extend short of the circumference of the disk 12, and that these lines are terminated with the male-and-female joints 25, the male parts 25A of which thrust the disk 12, leaving the female parts 25B on the disk, as shown in FIG. 4. A male-and-female joint 25 is an integral combination of male plug and female receptacle, which is equipped with a resilient metal piece 26 to accomodate and hold the male plug 25A of another male-and-female joint.

Figure 6:
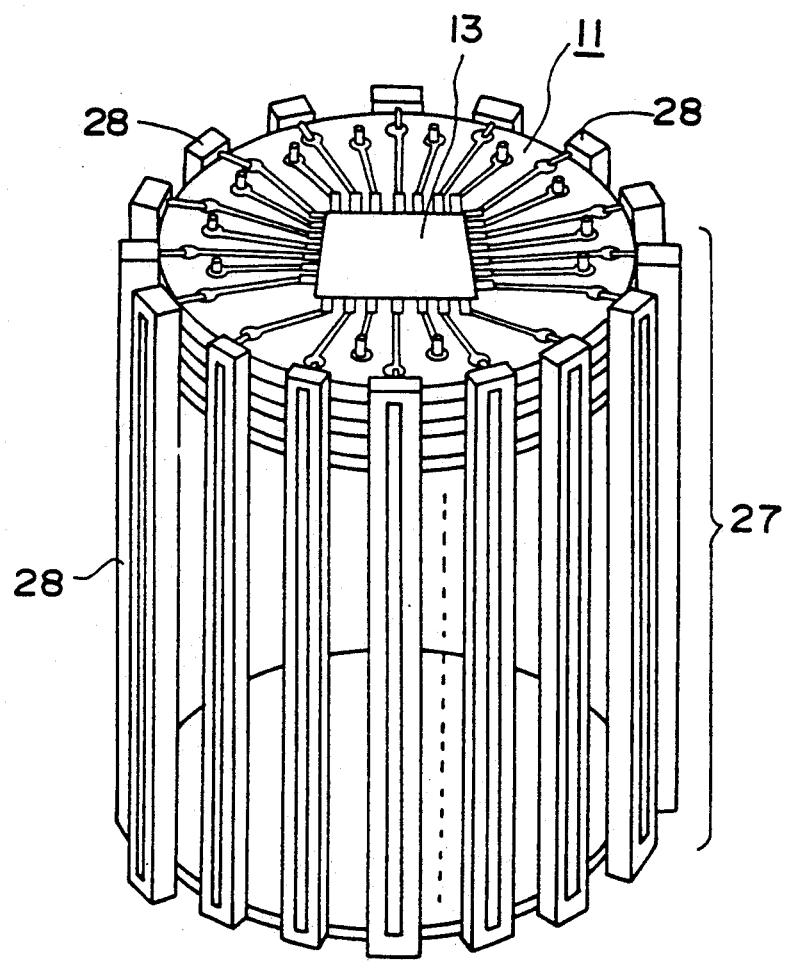
FIG. 6 is a perspective view of a radial bus system.
Figure 5:
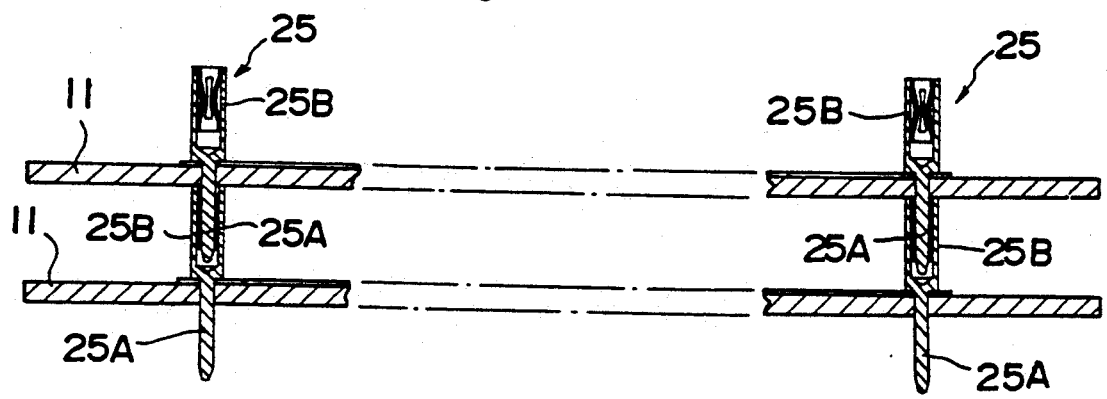
FIG. 5 is a longitudinal section of two disks assembled with the aid of male-and-female joints.
Figure 7:
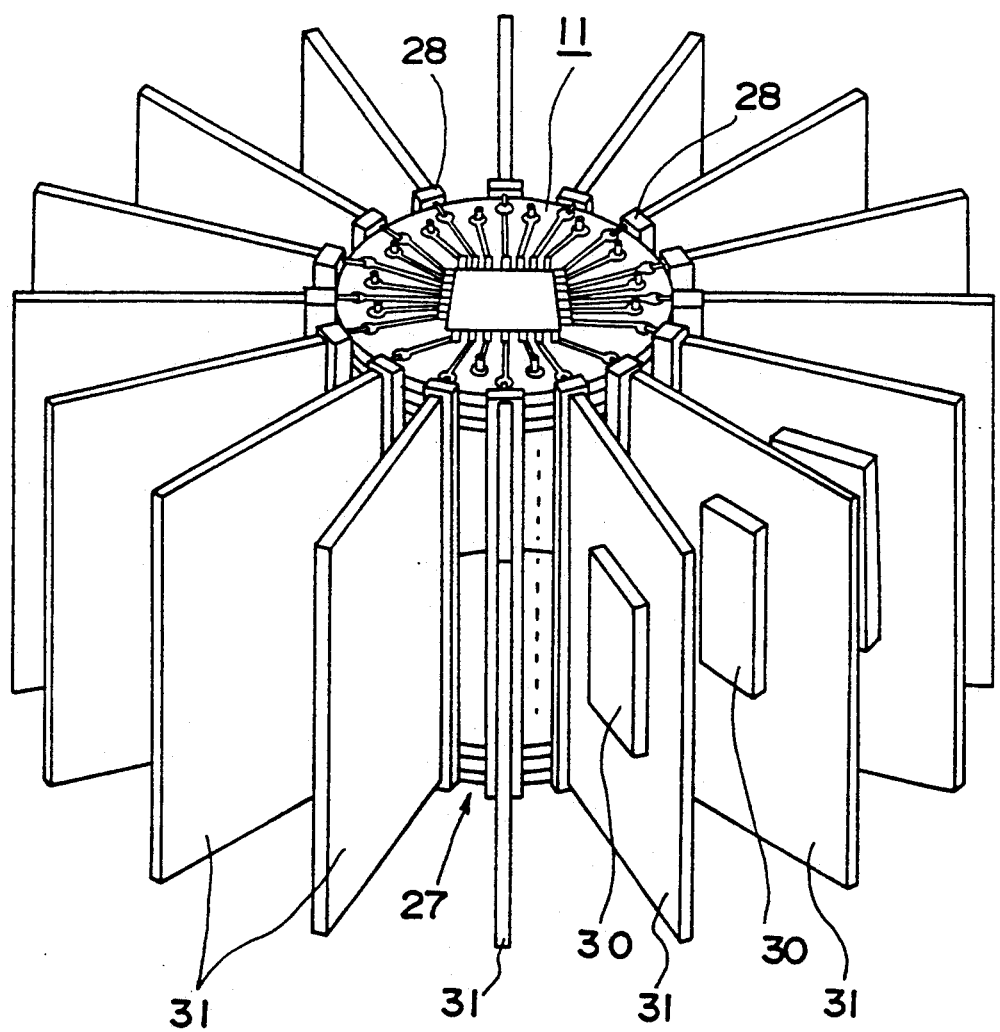
FIG. 7 is a perspective view of a parallel processing system according to one embodiment of the present invention.

With this arrangement a plurality of disks can be combined to form an integral stack of disks by inserting the male plugs 25A of the male-and-female joints 25 of the upper disk in the female plugs 25B of the male-and-female joints 25 of the lower disk, as shown in FIG. 5. Thereafter, longitudinal connectors 28 are applied to the cylindrical lamination thus formed by inserting the plugs 29 of the longitudinal connectors 28 in the receptacles 21 of all bus-printed and crossbar switch-attached disks 11 to provide a three-dimensional radial bus system 27 as shown in FIG. 6.

In the three-dimensional radial bus system 27 the communication, control, power and ground lines 20, 22, 23 and 24 of all disks are put longitudinally in angular registration, constituting the radial-and-longitudinal coplanar groups of communication, control, power and ground lines 20, 22, 23 and 24 integrally combined by the longitudinal connectors 28 and by the male-and-female joints 25.

In this cylindrical bus structure 27 the radial-and-longitudinal coplanar groups of communication lines 20 integrally combined by the longitudinal connectors 28 provide radially parallel bus units, and the communication lines 20 of each radially parallel bus unit may be allotted to data transfer lines, adressing lines and so forth.

A plurality of printed boards 31 equipped with processing units 30 are arranged around the cylindrical bus structure 27, and are fixed to the circumference of the circular cylinder by inserting the male plugs of the printed boards 31 into the female receptacles of the longitudinal connectors 28. Examples of the processing units on a printed board 31 are central processing units (CPU), memories, input/output processors to control input/output means for keyboards or displays.

A crossbar switch controller (not shown) is connected to the female parts 25B of the male-and-female joints 25 of the control lines 22 on the uppermost disk of the cylindrical bus structure 27. Likewise, a power supply (not shown) and earth are connected to the female parts 25B of the male-and-female joints 25 of the power lines 23 and the ground lines 24 on the uppermost disk of the cylindrical bus structure 27. With this connection all crossbar switches 13 can be responsive to same signals from the crossbar switch controller to permit the simultaneous closing-and-opening of selected contacts of all crossbar switches 13.

In this particular embodiment a plurality of male-and-female joints 25 are used for longitudinally connecting the control lines 22 of all disks. In place of such male-and-female joints 25, however, bar conductors may be used, longitudinally passing through the cylindrical structure.

Figure 8:
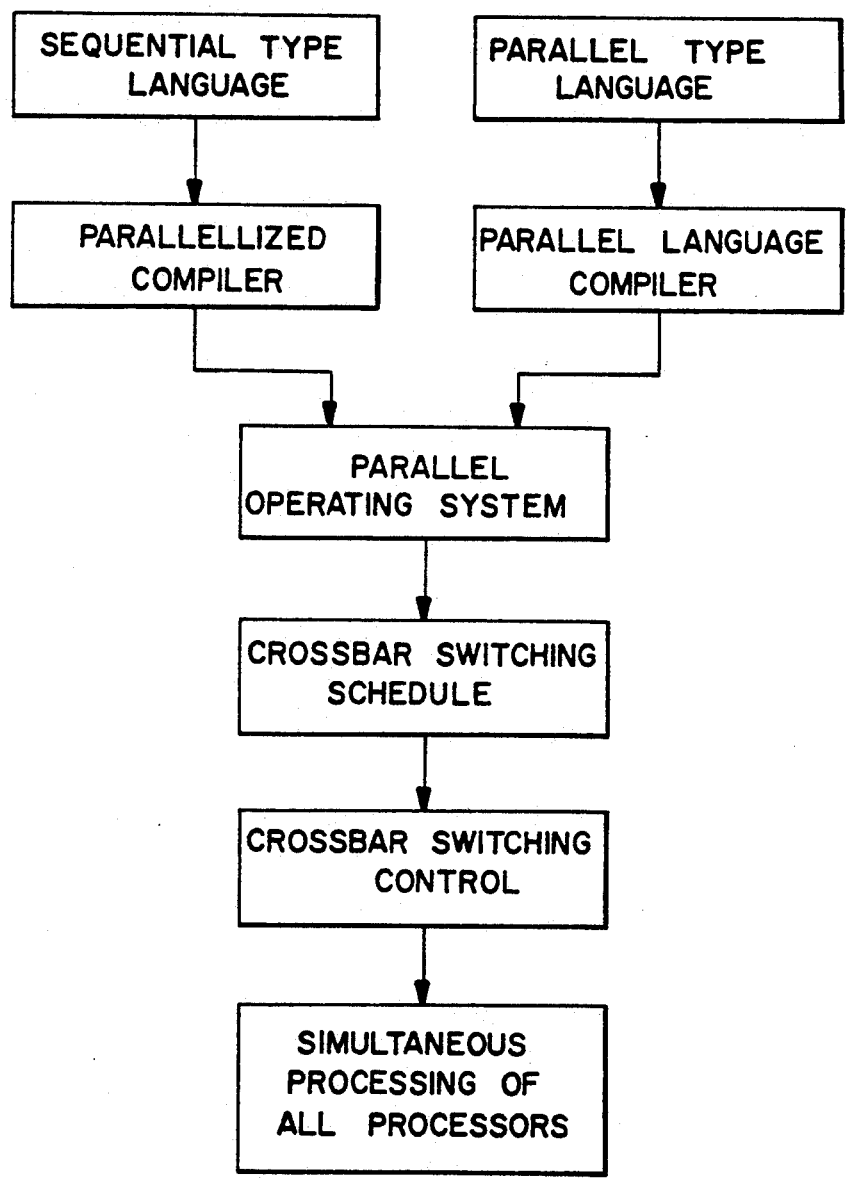
FIG. 8 shows how parallel processing may be effected in a parallel processing system according to the present invention.
Figure 9:
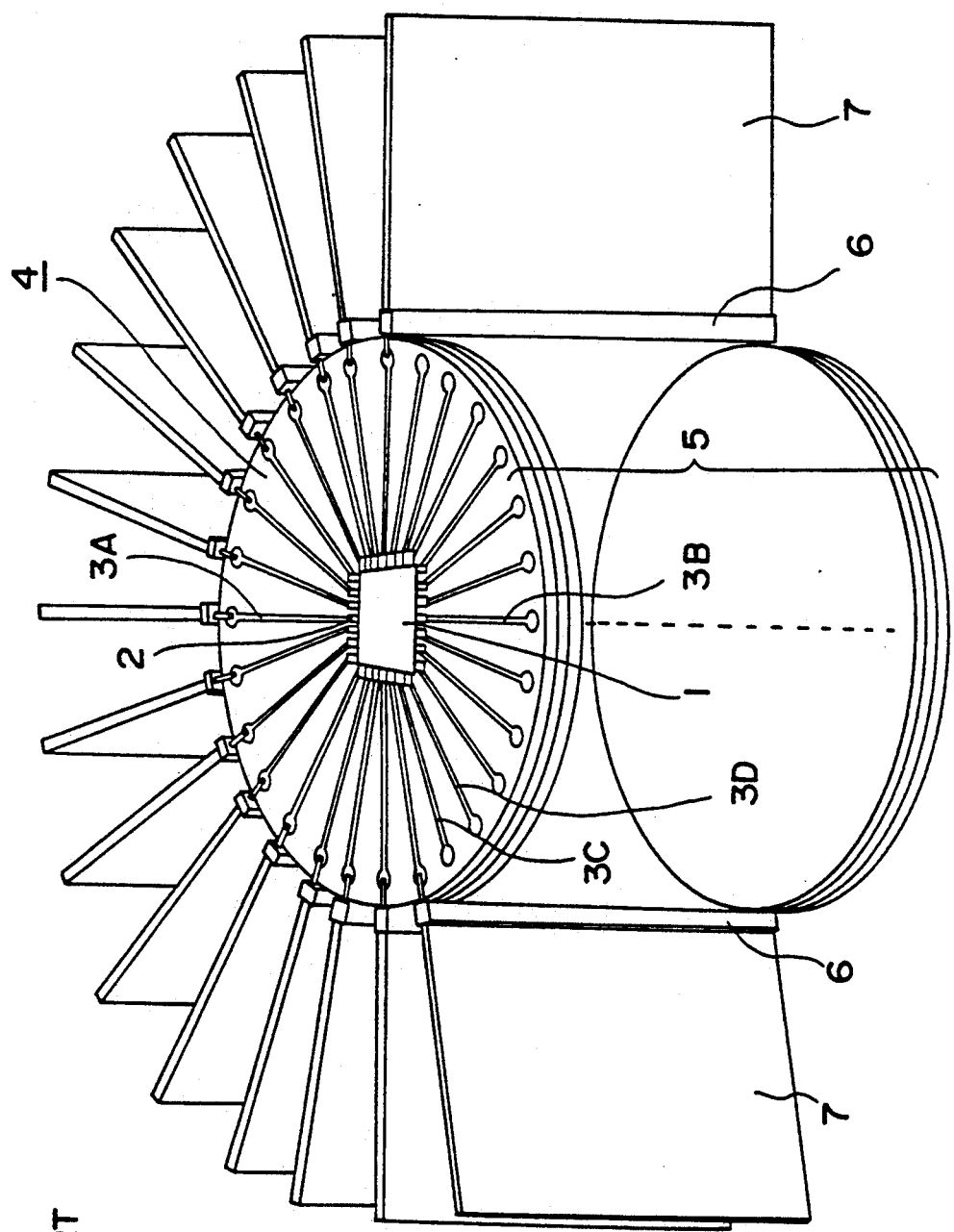
FIG. 9 is a perspective view of a conventional parallel processing system.

FIG. 8 shows how parallel processing may be effected in this parallel processing system.

Assume that a program according to which a given task such as color imaging processing is performed, is prepared in a sequential type language such as FORTRAN or in a parallel type language to be stored in memories.

For the program expressed in the sequential type language, a parallelizing compiler will find out which parts of the program can be parallel-performed, and then it will rearrange such parts in parallel tasks. As for the program expressed in the parallel type language a parallel language compiler will selectively pick up parallel parts so that parallel machine codes may be prepared.

The operating system of parallel machine will carry out dynamic allotment of processors, and the switching controlling schedule of each crossbar switch 13 will be prepared on the basis of the allotment of processors. In this way parallel-processing will be handled.

The crossbar switch controller performs the closing-and-opening of all crossing contacts 15 in each crossbar switch 13 according to the schedule, thereby permitting all processing units 30 to carry out simultaneously the processing of data.

Bus printed disks 11 are shown as having printed patterns on one side. They may have printed patterns on both sides, or may be of a multi-layered disk having signal conductors printed on each layer.

In the case where a parallel processing system according to the present invention is used in processing color-image data and outputting the processed data to a display device, red, green and blue data retrieved from different memories are further processed, and then the processed data are further transported to selected I/O CPUs by controlling the crossbar switch of the parallel-processing system, thus omitting data transfer between memories.

In the case where a parallel processing system according to the present invention is used in processing color printing, selected CPUs of the parallel processing system are allotted to yellow, cyan, magenta and black to perform required processings simultaneously. When processing large amounts of data it is possible to store divisions of data in different sections of a selected memory, thereby permitting distribution of the CPUs' processing domain. In this case data transfer can be substantially saved, and accordingly quick processing results.

In the case where a parallel processing system according to the present invention is used in producing motion pictures such as animated cartoons, one CPU can be allotted to each frame to perform necessary processing, thereby permitting real time processing.

As may be understood from the above, a parallel processing system according to the present invention uses a radial bus assembly comprising a stack of disks each having an integrated circuit crossbar switch fixed at its center, a plurality of communication lines of equal length radially extending from the communication terminals of the crossbar switch and terminating on the circumference of the disk, a plurality of control lines each being arranged between adjacent communication lines, and radially extending from the control terminals of the crossbar switch and terminating short of the circumference of the disk, and common connector means to electrically connect the terminations of the control lines of all disks in terms of same angular positions in common. This arrangement permits substantial reduction of disk size by shifting the control terminals from the circumference of the disk to the inside space thereof, accordingly reducing the whole size of the laminated cylindrical bus structure, and hence increasing the data transfer speed on radial communication lines.

Male-and-female joints are fixed to the disk with their male parts thrusting therethrough to connect the control lines of all disks longitudinally in common in terms of angular positions. This permits the easy disassembling of the laminated cylindrical bus structure for repair or change of defective disks, if any.

What is claimed is:

1. A parallel processing system comprising:
a radial bus assembly comprising a stack of disks each having an integrated circuit crossbar switch fixed at its center, a plurality of communication lines of equal length radially extending from the communication terminals of said crossbar switch and terminating on the circumference of the disk, a plurality of control lines each being arranged between adjacent communication lines, and radially extending from the control terminals of said crossbar switch and terminating short of the circumference of the disk, and common connector means to electrically connect the terminations of said control lines of all disks in terms of same angular positions longitudinally in common ;
a plurlaity of boards each having a processing unit and means to electrically connect said processing unit to the termination of each of said communication lines, said boards being arranged radially around said stack of disks; and
a switching control unit connected to said common connector means for controlling the closing-and-opening of the contacts of all crossbar switches in unison.

2. A parallel processing system according to claim 1 wherein said common connector means comprises male-and-female joints fixed to the disk with their male parts thrusting therethrough, and each of said disks has a plurality of receptacles on its circumference to terminate all communication lines.

* * * * *